(12) United States Patent
Phani et al.

(10) Patent No.: US 6,664,623 B1
(45) Date of Patent: Dec. 16, 2003

(54) METHOD TO IMPLEMENT SEALING AND ELECTRICAL CONNECTIONS TO SINGLE CELL AND MULTI-CELL REGENERATIVE PHOTOELECTROCHEMICAL DEVICES

(75) Inventors: George Phani, Illawong (AU); Jason Andrew Hopkins, Heathcote (AU); David Vittorio, Mortdale (AU); Igor Lvovich Skryabin, Yarralumia (AU)

(73) Assignee: Sustainable Technologies International PTY Ltd. (AU)

( * ) Notice: Subject to any disclaimer, the term of this patent is extended or adjusted under 35 U.S.C. 154(b) by 0 days.

(21) Appl. No.: 09/958,403

(22) PCT Filed: Apr. 7, 2000

(86) PCT No.: PCT/AU00/00289
§ 371 (c)(1),
(2), (4) Date: Feb. 4, 2002

(87) PCT Pub. No.: WO00/62315
PCT Pub. Date: Oct. 19, 2000

(30) Foreign Application Priority Data

Apr. 9, 1999 (AU) .............................................. PP9677

(51) Int. Cl.[7] .............................................. H01L 23/04
(52) U.S. Cl. ..................... 257/698; 257/439; 257/700; 257/431; 438/48; 438/54; 438/69
(58) Field of Search ................................. 257/431, 439, 257/459, 692–700, 709–711, 784; 438/617, 48, 54, 69

(56) References Cited

U.S. PATENT DOCUMENTS

| | | | |
|---|---|---|---|
| 4,266,338 A | 5/1981 | Chen et al. | 29/623.2 |
| 4,439,301 A | 3/1984 | Reichman et al. | 204/278 |
| 4,637,969 A | 1/1987 | Skotheim et al. | 429/111 |
| 6,297,900 B1 * | 10/2001 | Tulloch et al. | 359/275 |

FOREIGN PATENT DOCUMENTS

| | | | | |
|---|---|---|---|---|
| EP | WO 91/16719 | * | 10/1991 | H01G/9/20 |
| EP | 855726 | | 7/1998 | |

* cited by examiner

Primary Examiner—Nathan J. Flynn
Assistant Examiner—Scott R Wilson
(74) Attorney, Agent, or Firm—Ostrolenk, Faber, Gerb & Soffen, LLP

(57) ABSTRACT

A regenerative photoelectrochemical (RPEC) device comprising two substrates, wherein: one or both substrates are transparent and are coated with transparent electrical conductor (TEC) layer; one or more layers of porous wide band gap semiconductor is/are applied to selected area of said TEC layer and sensitised with dye; electrolyte is placed between said two substrates; hole(s) made in one or both said substrates to enable external electrical connection(s) to said RPEC device.

34 Claims, 3 Drawing Sheets

METHOD TO IMPLEMENT SEALING AND ELECTRICAL CONNECTIONS TO SINGLE CELL AND MULTI-CELL REGENERATIVE PHOTOELECTROCHEMICAL DEVICES

TECHNICAL FIELD

This invention relates to single cell and multi-cell regenerative photoelectrochemical (RPEC) devices, materials and methods used for electrical connections for such devices, and materials and methods used for sealing electrical connections and electrical networks in such devices.

Examples of the RPEC cells of the type concerned are disclosed in the following US patents:

U.S. Pat. No. 4,927,721, Photoelectrochemical cell; Michael Graetzel and Paul Liska, 1990.

U.S. Pat. No. 5,350,644, Photovoltaic cells; Michael Graetzel, Mohammad K Nazeeruddin and Brian O'Regan, 1994.

U.S. Pat. No. 5,525,440, Method of manufacture of photoelectrochemical cell and a cell made by this method; Andreas Kay, Michael Graetzel and Brian O'Regan, 1996.

U.S. Pat. No. 5,728,487, Photoelectrochemical cell and electrolyte for this cell; Michael Graetzel, Yordan Athanassov and Piere Bonhote, 1998.

BACKGROUND TO THE INVENTION

RPEC cells, as of the type disclosed in the above patents, are capable of being fabricated in a laminate arrangement between two large area substrates without undue expense. One typical arrangement involves two glass substrates, each utilising an electrically conducting coating upon the internal surface of the substrate. Another typical arrangement involves the first substrate being glass or polymeric and utilising an electrically conducting coating upon the internal surface of the substrate, with the second substrate being polymeric. In some arrangements, the internal surface of said second polymeric substrate is coated with an electrically conducting coating, whereas in other arrangements, said second polymeric substrate comprises a polymeric foil laminate, utilising adjacent electrically conductive material, such as carbon. Also, in some arrangements, the external surface may be a laminated metal film, and in other arrangements, the external surface may be coated by a metal. At least one of said first and second substrates is substantially transparent to visible light, as is the attached transparent electrically conducting (TEC) coating. RPEC cells contain a photoanode, typically comprising a dye-sensitised, nanoporous semiconducting oxide (eg. titanium dioxide known as titania) layer attached to one conductive coating, and a cathode, typically comprising a redox electrocatalyst layer attached to the other conductive coating or conductive material. An electrolyte containing a redox mediator is located between the photoanode and cathode, and the electrolyte is sealed from the environment.

Many RPEC single cell and module designs would be advantaged by an increased size of individual RPEC cells. However, such TEC coatings, which usually comprise a metal oxide(s), have high resistivity when compared with normal metal conductors, resulting in high resistive losses for large area RPEC cells, which affects the efficiency of the RPEC device especially in high illumination conditions. These losses can be reduced by the use of a pattern of electrically conductive material (ECM) in the form of bus bars, pads, grid of lines or any other pattern on the TEC coating(s). Conduction of electrons into and out of RPEC cells via the electrically conductive material typically necessitates penetration of the sealing of said cells by the electrically conductive material. Such penetration often presents difficulties in maintaining the hermetic sealing of said cells. The dominant selection criteria for the electrically conductive material deposited upon the TEC are cost and conductivity, so the selected material is commonly chemically reactive towards the electrolyte of the RPEC cells. Whilst this problem can be overcome by application of a sealant over the electrically conductive material the effectiveness of this seal is often compromised by the surface roughness and/or the porosity of the conductive coatings, especially with respect to TEC coatings. The inability of the sealant to completely fill the surface roughness and/or pores of the conductive coatings, especially with respect to TEC coatings, can lead to corrosion of the electrically conductive material and/or to degradation of the electrolyte, thereby reducing the performance of the cells.

OBJECTIVES OF THE INVENTION

It is an objective of this invention to provide materials and methods for electrical connections for use with RPEC cells and RPEC modules that will overcome the above-mentioned disadvantages in the art. It is a further objective of this invention to provide materials and methods for hermetic sealing of electrically conductive material in RPEC cells and RPEC modules that will overcome the mentioned disadvantages in the art.

OUTLINE OF THE INVENTION

This invention provides for electrical connections to be made to said electrically conductive coating (including TEC) and/or to said electrically conductive material (ECM) via holes in one or both of the substrates, thereby eliminating the need for said electrically conductive coating and/or said electrically conductive material to penetrate the hermetic seal of RPEC cells and modules.

This invention also provides for the deposition upon said TEC of a network of said electrically conductive material with an underlayer of protective material to seal the surface of the TEC and with an overcoat layer of protective material. The thickness of the underlayer and correspondingly the electrical conduction path length in the underlayer is negligible in comparison to that in electrically conductive material. The underlayer material is selected to be chemically inert towards the electrolyte of the RPEC cell. Such network of said electrically conductive material is particularly advantageous for efficient collection and distribution of electrons in RPEC cells.

In order to maximise light exposure for solar cells and to minimise costs, it is of particular importance to minimise the surface area covered by patterns of said ECM. Significant effort has been expended to design electrically conducting material patterns to minimise said material costs and to minimise said covered surface area. It is a feature of this invention that location of said electrical connections of the invention may be made wherever appropriate, thereby providing a wide range of flexibility in said pattern design and hence a wide range of device layouts. For example, a star-shaped busbar design layout could utilise a single central electrical connection of the invention compared to the four penetrations of the seal required by a conventional design of the same said covered surface area which would comprise an inverse shape for each arm of the star. Alternatively, said conventional design of the same said covered surface area could be connected by four electrical connections of the invention, similarly avoiding four penetrations of the seal. This invention anticipates a wide range of alternative layouts of said electrically conducting material including the use of small lines connected to busbars. Whilst not limited to such substrates, the invention is particularly suited to providing electrical connections to said ECM deposited upon electrically conducting coatings on glass substrates, including transparent electrically conducting (TEC) coatings. Additionally, this invention provides for external electrical connection of RPEC cells in series and/or parallel to realise well-known advantages of performance and reliability.

According to one aspect of the invention, an RPEC cell, that comprises in part, firstly one substrate that is successfully coated with transparent electrically conductive coating, a dye-sensitised, nanoporous semiconducting oxide, electrically insulating layer, catalytical layer and electrically conductive layer and secondly another substrate, whereby one or both of said substrates is substantially transparent to visible light, and one or more holes are made through one or both substrates to provide electrical connection to said electrically conductive coating and/or electrically conducting layer. In the case where an ECM pattern is deposited on to electrically conductive coating and/or electrically conductive layer then said electrical connections are made directly to ECM.

According to another aspect of the invention, an RPEC cell, that comprises in part, firstly one substrate that is successively coated with an electrically conducting coating (TEC) and a dye-sensitised, nanoporous semiconducting oxide, and secondly another substrate that is successively coated with an electrically conducting coating and a redox electrocatalyst, whereby one or both of said substrates and their electrically conducting coatings are substantially transparent to visible light, and one or more holes are made through one or both substrates to provide electrical connection to said electrically conductive coating. In the case where one or more layouts of an electrically conducting material (ECM) are deposited upon one or both of said conducting coatings on said substrates, connection is made through these mentioned holes to said first electrically conducting material (ECM).

According to still another aspect of the invention, an RPEC cell, that is of the first or second aspect of the invention contains additionally a network of said electrically conductive material (ECM) with an underlayer of protective material to seal the surface of the TEC and with an overcoat layer of protective material.

A coating material is optionally applied to coat all or part of the internal surfaces of said hole(s) and forms a mechanical bond to said substrates, whereby if said coating material is non-conducting (e.g. ceramic glaze) it is not applied to coat said first electrically conducting material and whereby if said coating material is electrically conducting it may be applied to coat said first electrically conducting material. One or more electrical conductors ( e.g. pin, wire, solder, conductive paste) are inserted into each said hole(s) and said hole(s) are filled with a second electrically conductive material or non-conducting material (e.g. ceramic glaze), thereby forming an electrical connection between said electrical conductor(s) and said first electrically conducting material, and forming a mechanical bond between said electrical conductor(s) and said substrates. The materials used in such electrical connection are selected to ensure an impermeable seal to the device. A layer of protective material may be deposited over said layout(s) of first electrically conducting material (ECM) and thereby also over the electrical connection(s) to said first electrically conducting material. The invention provides for the optional protective material to be applied before or after electrical connection described herein.

In one preferred embodiment of the invention, layouts of electrically conducting material (ECM), such as silver paste, are deposited, e.g. by screen printing, upon the TEC coatings of the two glass substrates of an RPEC cell. A hole is made through each coated glass substrate to said electrically conducting material by any of the conventional techniques, including, but not limited to sand blasting, water jet cutting, laser cutting and drilling. Electrically conductive material, such as silver paste, is applied to the holes to coat the internal surfaces of the holes, to mechanical bond to the substrates and to form electrical connections to the TEC coatings and/or to said electrically conducting material deposited upon the TEC coatings. An electrical conductor, such as a wire or pin, is then inserted in each hole and is electrically and mechanically bonded to the conductive material coating the hole by filling the hole with a conductive filler, such as standard silver solder, silver paste, particle-loaded conductive polymer and the like. If required, the layouts of electrically conducting material deposited upon the TEC coatings of the glass substrates may be overcoated by a protective layer, such as a polymer or glass frit coating.

In another preferred embodiment of the invention, the wires or pins in the previous embodiment are replaced by patterns of electrically conducting material deposited upon the non-TEC-coated surface of the glass substrates, where said patterns make electrical connections to the conductive material coating the holes and/or the conductive filler in the holes. Separate electrical connections may then be made to said patterns at locations remote from the holes.

In another preferred embodiment of the invention, two or more electrical connections, as described in the previous embodiment, are made in the device and said pattern in the previous embodiment is replaced by one or more patterns of electrically conducting material deposited upon the non-TEC-coated surface of the glass substrate, whereby such patterns may join two or more said electrical connections and/or may allow separate electrical connection(s) to be made to said pattern(s) at a location(s) remote from said hole(s).

This invention not only enables neat electrical connections to individual RPEC cells, but also enables external electrical connection of individual RPEC cells to form RPEC modules, including, but not limited to, external series connection to form modules with higher voltages than individual cells and with lower power losses than for some module designs where resistive losses in the TEC coatings are higher.

This invention also provides that the RPEC cell is as described in the above aspect of the invention, except that one or more sealant coatings are applied to part or all of said conductive coating(s) to minimise or eliminate contact between the cell electrolyte with said layouts of electrically conducting material and said electrical connections, whereby such contact occurs through leaks arising from the surface roughness and/or porosity of the conductive coating (s) at the junction of said conductive coating(s) and the sealant over said electrically conductive material and said electrical connections.

In one preferred embodiment of the invention, an oxide coating, prepared, for example, by a sol-gel dip-coating process, is applied to the TEC-coated glass substrates of an RPEC cell. In another preferred embodiment of the invention, an oxide coating, prepared, for example, by a sol-gel nozzle-deposition process, is applied only to the regions of two TEC-coated glass substrates of an RPEC cell upon which said sealant said sealant coatings were to be deposited and upon which said electrical connections were to be formed. In both of the immediately preceding embodiments of the invention, the oxide coating may comprise, but not be limited to, indium tin oxide, fluorine-doped tin oxide, doped zinc oxide, cadmium stannate, titania, lead zirconium titanate and such like, thereby resulting in reduced surface roughness and/or porosity of the conducting coating(s), and whereby the seal is leak-tight at the junction of said conductive coating(s) and said sealant over said electrically conductive material and said electrical connections. In both of the immediately preceding embodiments of the invention, the conductivities of the oxide coatings are such that increases in the cell resistances arising from these coatings do not significantly affect RPEC device performance.

DESCRIPTION OF THE DRAWINGS

Having broadly portrayed the nature of the present invention, embodiments thereof will now be described by way of example and illustration only. In the following description, reference will be made to the accompanying drawings in which.

DETAILED DESCRIPTION

Figure 1:
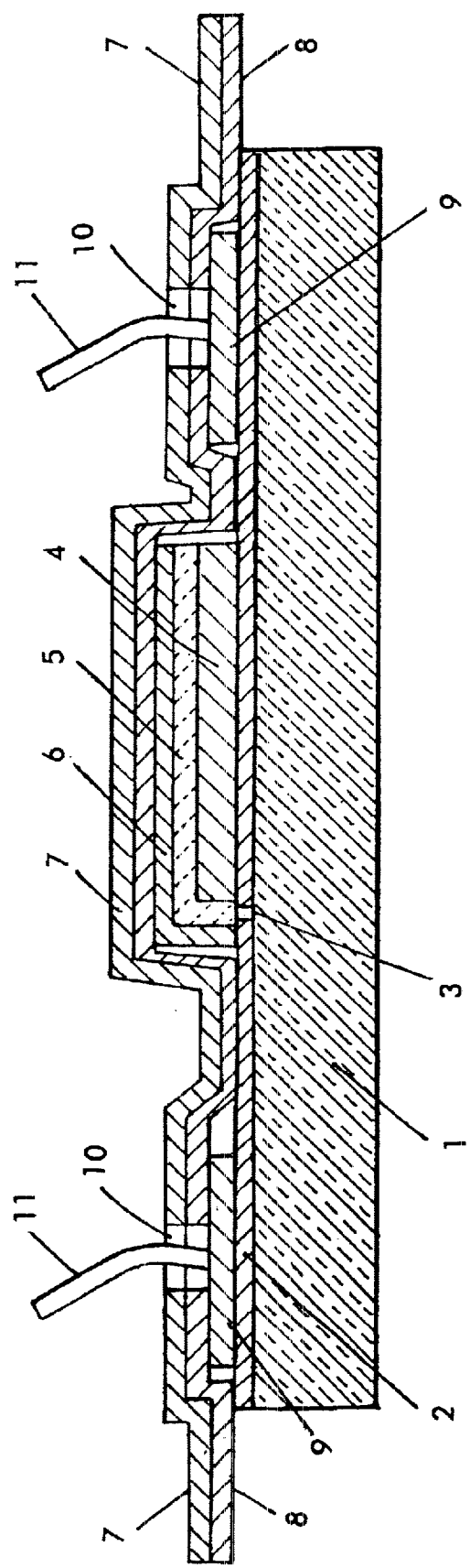
FIG. 1 is an enlarged partial transverse section of the electrical connection formed in accordance with a chosen example of the invention.

With reference to FIG. 1, the RPEC module compromises a glass substrate (1) which is coated with a transparent electron conductor (TEC) (2). This TEC layer is selectively isolated (3) to separate each individual cell Titania (4) is deposited onto the TEC glass layer followed by a ceramic oxide spacer layer (5) and a carbon based catylist/conductor layer (6). The assembly is sensitised with a Ruthenium dye and a redox electrolyte. A conductive metallic foil pad (9) is conductively bonded to the TEC layer and a second substrate—metallic/polymer backing laminate (7,8) with preformed holes (10) is sealed over the RPEC device, exposing the conductive pad (9) through holes (10) in the second substrate (7,8). A connector pin (11) is then attached to the foil pad to make an electrical connection With reference to FIG. 2, the RPEC cell comprises two glass substrates (1), both of which are coated with TEC layer (doped tin oxide) (2) and patterned conductive material (12) (Silver). An underlayer (13) of indium tin oxide is deposited between sealant layer (14) (low lead glass frit) and TEC layer. Holes (10) through the substrates and coatings have been made by laser drilling from the non-coated glass surface. The internal surface of the holes in the glass and coatings and a small area on the non-coated surface of the glass have been coated by a separate application of silver paste (15) that is bonded to substrate (1) and is electrically connected to said pattern of conductive material (12). Standard copper connectors (16) are bonded to the substrates (1) and electrically connected to said silver layer (15). The holes are sealed with silicone based sealant (17). The first substrate is coated by a layer of titania (4) and dye sensitised; thin electrocatalytical layer of Platinum (18) is deposited on to the second substrate. The RPEC cell is sealed by polymeric sealants (19) and filled with an electrolyte (20).

Figure 3:
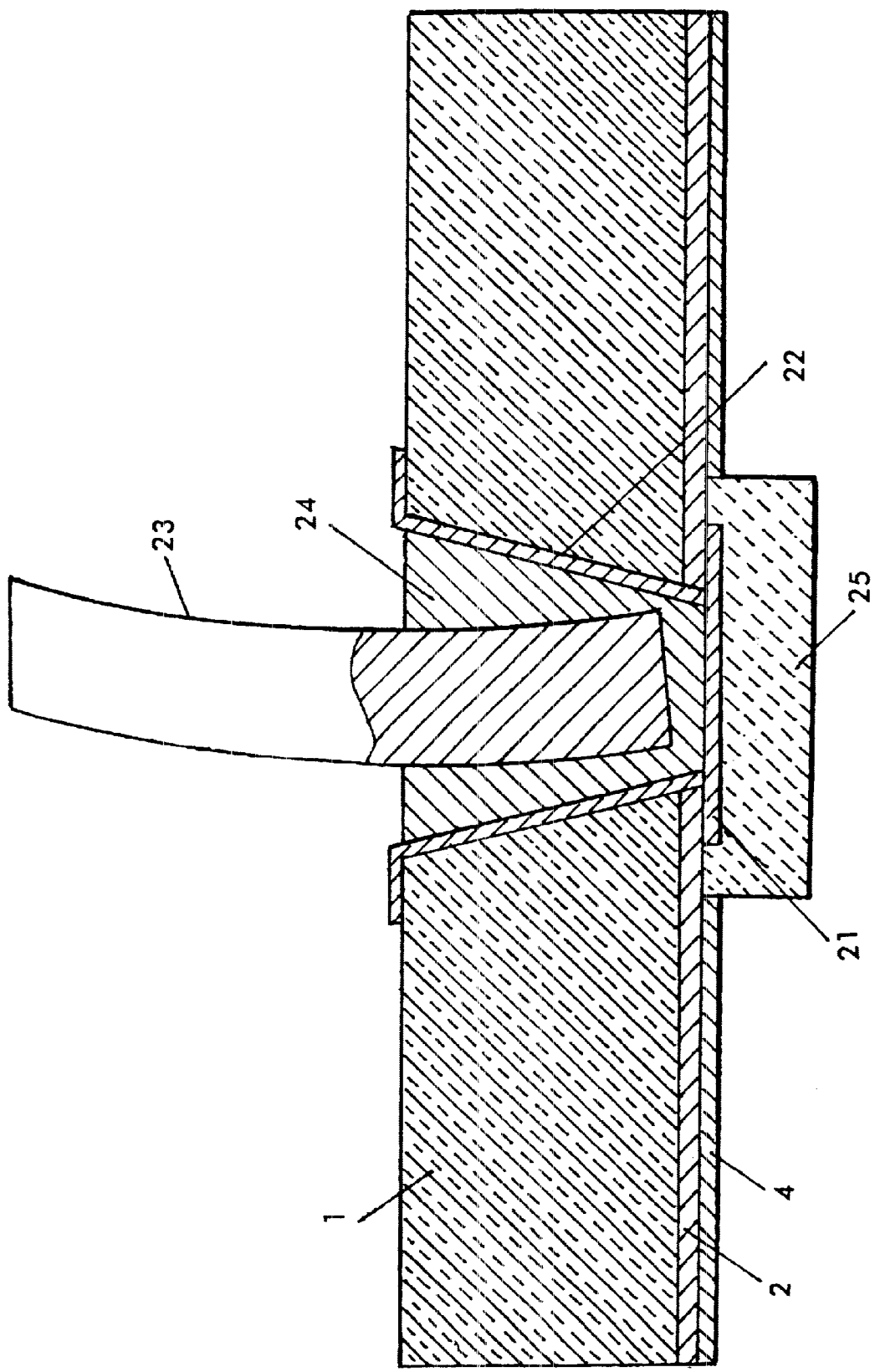
FIG. 3 is an enlarged partial transverse section of the region surrounding two electrical connections that form an external series connection for a RPEC module formed in accordance with a chosen example of the invention.

With reference to FIG. 3, a glass substrate (1) is coated with a transparent electronic conductor (TEC) coating (2), a screen printed titania coating (4) and a screen printed strip of glass frit silver paste (21). A hole through the substrate and coatings has been made by sand blasting from the non-coated glass surface. The internal surface of the hole in the glass and coatings has been coated by a separate application of silver paste (22) that is bonded to the substrate (1) and is electrically connected to said strip of silver paste (21). A standard copper connector (23) is electrically and mechanically bonded to said silver paste coating (23) by a conductive filler of silver solder (24). Strips of polymeric sealant (25) are overlaid upon said strip of silver paste (21) as a protective overlayer.

EXAMPLES

Example 1

(see FIG. 1)

Standard window glass with a doped tin oxide TEC film is selectively isolated using a $CO_2$ laser. A titania paste is then screen printed and fired in a belt furnace. A ceramic oxide spacer layer is also screen printed over the titania and fired in a belt furnace. A carbon based catylist layer is then screen printed as to overlap the TEC glass isolation and the three layers are then fired once more in a belt furnace. The module is then placed in an alcohol solution of cis-[bis thiacyanato bis[4,4-dicarboxy-2-2-bipyridine Ru(II)] sensitiser at room temperature for several hours and then rinsed and dried with nitrogen. An electrolyte containing an iodide/triiodide redox couple is then placed dropwise onto the dyed layers and allowed to soak in as pads of thin copper foil (3 mm×3 mm) are conductively bonded to the TEC glass using a conductive paste. A laminate material consisting of an Aluminium backing and surlyn polymer is preformed with holes to be positioned over the copper pads. The laminate material is then placed over the module and heat sealed using a hot stamping technique. The copper pads, which are now accessable through holes in the laminate, are connected to copper wires using a conductive silver epoxy.

Example 2

Figure 2:
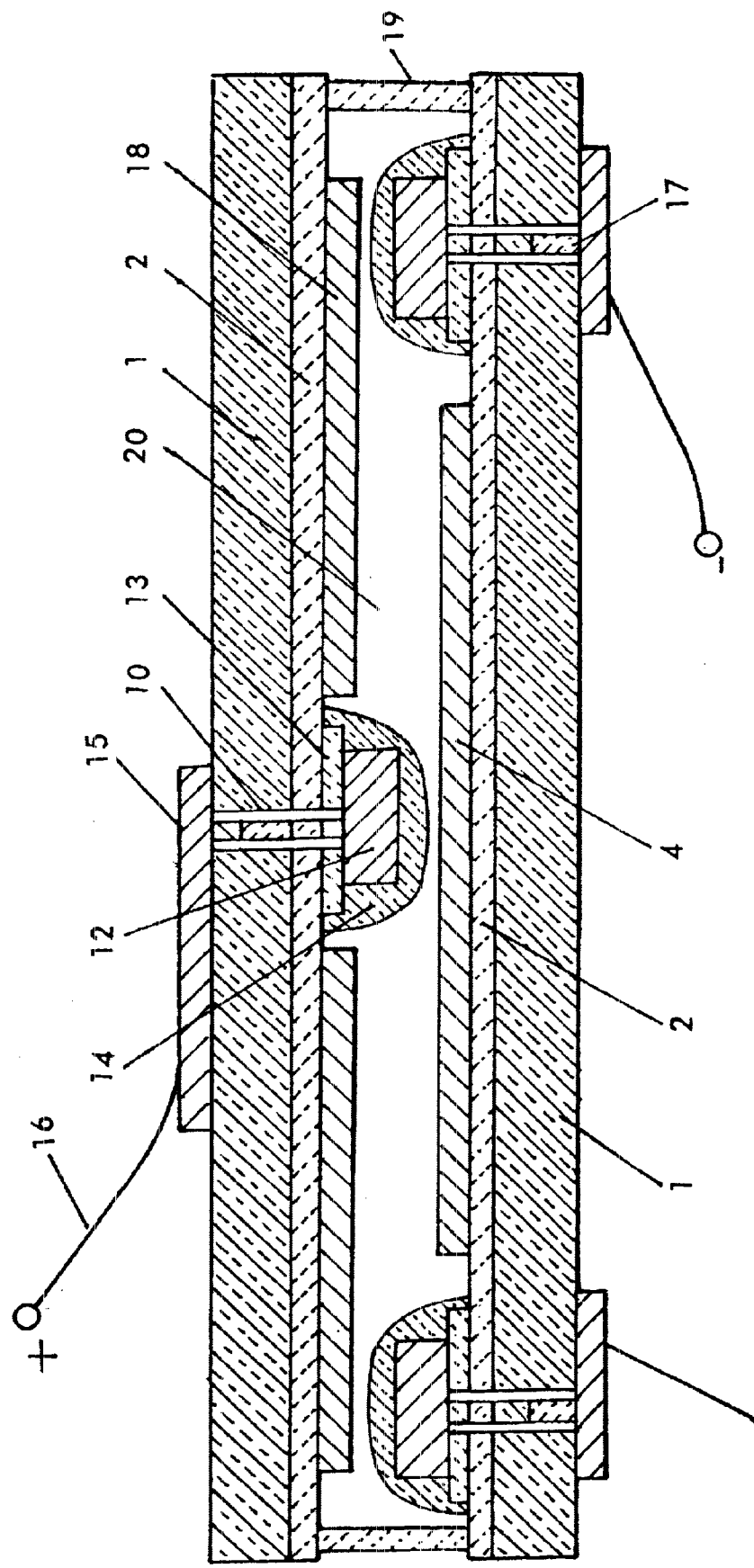
FIG. 2 is an enlarged partial transverse section of the electrical connection formed in accordance with another chosen example of the invention.

(see FIG. 2)

With reference to FIG. 2, The RPEC cell comprises two glass substrates (1), both of which are coated with TEC layer (doped tin oxide) (2) which is isolated using a pulsed YAG laser. Patterned conductive silver material (7) is screen printed and fired. A protective layer (6) of indium tin oxide is deposited between conductive material and TEC layer prior to screen printing. A polymeric sealant layer (8) is deposited over the conductive material. Holes (9) through the substrates and coatings are made by laser drilling from the non-coated glass surface. The internal surface of the holes in the glass and coatings and a small area on the non-coated surface of the glass has been coated by a separate application of silver paste (10) that is bonded to substrate (1) and is electrically connected to pattern of conductive material (7). Standard copper wires (11) are bonded to the substrates (1) and electrically connected to the silver layer (10). The holes are sealed with silicone based sealant (13). A titania paste (3) is then screen printed and fired in a belt furnace. The titania electrode is then placed in an alcohol solution of cis-[bis thiacyanato bis[4,4-dicarboxy-2-2-bipyridine Ru(II)] sensitiser at room temperature for several hours then rinsed and dried in nitrogen. A thin electrocatalytical layer of Platinum (4) is deposited on to second substrate and fired. An impermeable surlyn seal (12) is applied to separate the electrolytes in the individual RPEC cells and seal from the environment. The RPEC cell is filled with an electrolyte (5) through a hole (not shown) and sealed by a silicone based sealant.

Example 3

As shown in FIG. 3

Example 4

The following example is illustrative only, and other deposition methods, uses, adaptations and features of the invention will be apparent to those of ordinary skill in the art.

Manufacture of Protective Oxide Layer.

Diethanolamine in the amount of 323 g is placed with mixing into the first container of 2917 g of dry isopropanol. Titanium alkoxide in the form of $Ti(OC_3H_7)_4$, in the amount of 873 g is placed with mixing into the first container. Water in the amount of 111 g is placed with mixing into the second container of 868 g of isopropanol. The water/isopropanol solution in the second container is slowly placed with mixing into the first container. The final solution is applied to the substrate with a controlled thickness by dip coating. Upon withdrawal of the substrate into a controlled humidity atmosphere in which the humidity is maximised without allowing condensation, evaporation and hydrolysis simultaneously occur, leaving a residue. The coated substrate is heated at about 80 degrees C. for 30 minutes. The coated substrate is then heated at about 50 degrees C. per minute to about 500 degrees C. for about 20 minutes, and is then cooled at a similar rate, i.e., 50 degrees C. per minute. The result is a clear, hardened and transparent layer.

Two such coated substrates were used to manufacture an RPEC cell as described above. It was found that initial cell efficiency was virtually identical when compared to an RPEC cell manufactured without the oxide coating of the invention, and that the cell using the invention did not show degradation over three months, whereas the cell manufactured without the oxide coating showed degradation from corrosion of the silver grid lines.

What is claimed is:

1. A regenerative photoelectrochemical (RPEC) device comprising two substrates, wherein:
   one or both substrates are transparent and are coated with a transparent electrical conductor (TEC) layer;
   one or more layers of porous wide band gap semiconductor is/are applied to a selected area of said TEC layer and sensitised with dye;
   electrolyte is placed between said two substrates;
   hole(s) are made in one or both said substrates to enable external electrical connection(s) to said RPEC device.

2. The RPEC device according to claim 1, wherein said hole(s) is(are) made in a substrate to enable external electrical connection(s) to said TEC layer of this substrate.

3. The RPEC device according to claim 2, wherein a pattern of first electrically conductive material (ECM) is deposited on TEC layer, overlapping the hole( ) in the substrate, but not overlapping with said selected area of said TEC layer; said external electrical connection are made to said ECM pattern.

4. The RPEC device according to claim 2, wherein one or more electrical conductors (e.g. pin, wire, solder, conductive paste) are inserted into each said hole(s) and said hole(s) are filled with a second electrically conductive material or non-conducting material (e.g. ceramic glaze), thereby forming an electrical connection between said electrical conductor(s) and said first electrically conducting material, and forming a bond between said electrical conductor(s) and said substrates and sealing said hole(s).

5. The RPEC device according to claim 3 wherein said first ECM comprises one or more of thin or thick film(s) of electrical conductor(s), electrical tape(s), metal pad(s) or electrical wires that are bonded to and in electrical contact with said TEC layer.

6. The RPEC device according to claim 3, wherein said ECM coating is extended to coat all or part of the internal surfaces of said hole(s) and provide said external electrical connection(s) and whereby said hole(s) are filled with the same or a second electrically conductive material or non-conducting material (e.g. ceramic glaze), forming a bond with said ECM coating and sealing said hole(s).

7. The RPEC device according to claim 3, wherein one or more electrical conductors (e.g. pin, wire, solder, conductive paste) are inserted into each said hole(s) and said hole(s) are filled with a second electrically conductive material or non-conducting material (e.g. ceramic glaze), thereby forming an electrical connection between said electrical conductor(s) and said first electrically conducting material, and forming a bond between said electrical conductor(s) and said substrates and sealing said hole(s).

8. The RPEC device according to claim 5, wherein protective material is applied over said first electrically conductive material to protect said ECM from electrolyte of said RPEC cell.

9. The RPEC device according to claim 8, wherein a thin underlayer is placed on said TEC layer to seal the surface of the TEC layer with an overcoat layer of said protective material.

10. The RPEC device according to claim 1, wherein said hole(s) are made in a first substrate to provide external electrical connection(s) to the area other than the selected area(s) of said TEC layer of the opposing (second) substrate.

11. The RPEC device according to claim 10 wherein an ECM layer is deposited on said other area(s) and comprises one or more of thin or thick film(s) of electrical conductor(s), electrical tape(s), metal pad(s) or electrical wires that are bonded to and in electrical contact with said TEC layer.

12. The RPEC device according to claim 10, wherein electrical wire(s) or pin(s) inserted into hole(s) of the first substrate is(are) electrically connected to said ECM of the second substrate.

13. The RPEC device according to claim 12, wherein said wire(s) or pin(s) is(are) partially coated with an electrically insulating layer.

14. The RPEC device according to claim 12, wherein said wire(s) or pin(s) is(are) partially coated with a protective layer to prevent corrosion of the electrical connector.

15. The RPEC device according to claim 11, wherein electrical wire(s) or pin(s) inserted into hole(s) of the first substrate is(are) electrically connected to said ECM of the second substrate.

16. The RPEC device according to claim 15, wherein said wire(s) or pin(s) is(are) partially coated with an electrically insulating layer.

17. The RPEC device according to claim 15, wherein said wire(s) or pin(s) is(are) partially coated with a protective layer to prevent corrosion of the electrical connector.

18. A regenerative photoelectrochemical (RPEC) device comprising two substrates, wherein:

at least one of the substrates is transparent and coated with a transparent electrical conductor (TEC) layer;

at least one layer of porous wide band gap semiconductor is disposed on a selected area of said TEC layer and sensitised with dye;

electrolyte is disposed between said two substrates; and at least one hole is provided in at least one of said substrates to enable at least one external electrical connection to said RPEC device.

19. The RPEC device according to claim 18, wherein said at least one hole is provided in at least one of the substrates to enable at least one external electrical connection to said TEC layer of said at least one of the substrates.

20. The RPEC device according to claim 19, wherein a pattern of first electrically conductive material (ECM) is deposited on said TEC layer, overlapping the at least one hole in the substrate, but not overlapping with said selected area of said TEC layer; said at least one external electrical connection being made to said ECM.

21. The RPEC device according to claim 19, wherein at least one electrical conductor is inserted into said at least one hole and said at least one hole is filled with one of a second electrically conductive material and a non-conducting material thereby forming an electrical connection between said at least one electrical conductor and said first electrically conducting material, and forming a bond between said at least one electric conductor and said substrates and sealing said at least one hole.

22. The RPEC device according to claim 20, wherein said first ECM comprises at least one thin or thick film comprising an electrical conductor, electrical tape, metal pad or electrical wire that is bonded to and in electrical contact with said TEC layer.

23. The RPEC device according to claim 20, wherein said first ECM is extended to coat at least part of the internal surfaces of said at least one hole and provide said at least one external electrical connection and whereby said at least one hole is filled with the same or a second electrically conductive material or a non-conducting material forming a bond with said ECM and sealing said at least one hole.

24. The RPEC device according to claim 20, wherein at least one electrical conductor is inserted into said at least one hole and said at least one hole is filled with one of a second electrically conductive material or non-conducting material thereby forming an electrical connection between said electrical conductor and said first electrically conducting material, and forming a bond between said at least one electrical conductor and said substrates and sealing said at least one hole.

25. The RPEC device according to claim 22, wherein protective material is applied over said first electrically conductive material to protect said ECM from electrolyte of said RPEC cell.

26. The RPEC device according to claim 25, wherein a thin underlayer is placed on said TEC layer to seal a surface of the TEC layer with an overcoat layer of said protective material.

27. The RPEC device according to claim 18, wherein said at least one hole is provided in a first of said substrates to provide said at least one external electrical connection to an area other than the selected area of said TEC layer of the second substrate.

28. The RPEC device according to claim 27, wherein an ECM layer is deposited on said other area and comprises at least one thin or thick film comprising at least one of an electrical conductor, electrical tape, metal pad and electrical wire that is bonded to and in electrical contact with said TEC layer.

29. The RPEC device according to claim 27, wherein at least one electrical wire or pin is disposed in said at least one hole of the first substrate and is electrically connected to said ECM of the second substrate.

30. The RPEC device according to claim 29, wherein said wire or pin is partially coated with an electrically insulating layer.

31. The RPEC device according to claim 29, wherein said wire or pin is partially coated with a protective layer to prevent corrosion of the electrical connector.

32. The RPEC device according to claim 28, wherein at least one electrical wire or pin is disposed in said at least one hole of the first substrate and is electrically connected to said ECM of the second substrate.

33. The RPEC device according to claim 32, wherein said wire or pin is partially coated with an electrically insulating layer.

34. The RPEC device according to claim 32, wherein said wire or pin is partially coated with a protective layer to prevent corrosion of the electrical connector.

* * * * *